(12) United States Patent
Hertkorn et al.

(10) Patent No.: US 9,343,615 B2
(45) Date of Patent: May 17, 2016

(54) METHOD FOR PRODUCING AN OPTOELECTRONIC SEMICONDUCTOR CHIP AND OPTOELECTRONIC SEMICONDUCTOR CHIP

(75) Inventors: Joachim Hertkorn, Alteglofsheim (DE); Karl Engl, Pentling (DE); Berthold Hahn, Hemau (DE); Andreas Weimar, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 47 days.

(21) Appl. No.: 14/345,852

(22) PCT Filed: Aug. 23, 2012

(86) PCT No.: PCT/EP2012/066459
§ 371 (c)(1),
(2), (4) Date: Jun. 11, 2014

(87) PCT Pub. No.: WO2013/045181
PCT Pub. Date: Apr. 4, 2013

(65) Prior Publication Data
US 2014/0346541 A1    Nov. 27, 2014

(30) Foreign Application Priority Data
Sep. 30, 2011 (DE) .......... 10 2011 114 671

(51) Int. Cl.
*H01L 21/00* (2006.01)
*H01L 33/00* (2010.01)
(Continued)

(52) U.S. Cl.
CPC ........ *H01L 33/0075* (2013.01); *H01L 21/0242* (2013.01); *H01L 21/0254* (2013.01);
(Continued)

(58) Field of Classification Search
CPC ..... H01L 33/24; H01L 33/32; H01L 33/0075; H01L 33/025; H01L 33/12; H01L 33/0066; H01L 33/22; H01L 33/0079; H01L 33/007
USPC .......... 438/22, 24, 46, 47, 28, 29, 25
See application file for complete search history.

(56) References Cited

U.S. PATENT DOCUMENTS

| 5,741,724 A | 4/1998 | Ramdani et al. |
| 9,012,921 B2 * | 4/2015 | Lin .......... H01L 33/22 257/13 |

(Continued)

FOREIGN PATENT DOCUMENTS

| CN | 101124353 | 2/2008 |
| DE | 10034263 | 1/2002 |

(Continued)

OTHER PUBLICATIONS

English translation of Taiwanese Notification of the Opinion of Examination dated Aug. 29, 2014 from corresponding Taiwanese Application No. 101135504.
(Continued)

*Primary Examiner* — Hoa B Trinh
(74) *Attorney, Agent, or Firm* — DLA Piper LLP (US)

(57) ABSTRACT

A method of producing an optoelectronic semiconductor chip includes providing a growth substrate, producing a III nitride nucleation layer on the growth substrate by sputtering, wherein a material of the growth substrate differs from a material of the nucleation layer, and growing a III nitride semiconductor layer sequence having an active layer onto the nucleation layer.

17 Claims, 6 Drawing Sheets

(51) Int. Cl.
*H01L 21/02* (2006.01)
*H01L 33/22* (2010.01)
*H01L 33/02* (2010.01)
*H01L 33/12* (2010.01)
*H01L 33/24* (2010.01)
*H01L 33/32* (2010.01)

(52) U.S. Cl.
CPC .... *H01L21/02458* (2013.01); *H01L 21/02488* (2013.01); *H01L 21/02631* (2013.01); *H01L 21/02664* (2013.01); *H01L 33/007* (2013.01); *H01L 33/0066* (2013.01); *H01L 33/0079* (2013.01); *H01L 33/025* (2013.01); *H01L 33/12* (2013.01); *H01L 33/22* (2013.01); *H01L 33/24* (2013.01); *H01L 33/32* (2013.01); *H01L 2924/0002* (2013.01)

(56) References Cited

U.S. PATENT DOCUMENTS

| | | |
|---|---|---|
| 2007/0141823 A1 | 6/2007 | Preble et al. |
| 2007/0190676 A1 | 8/2007 | Chu et al. |
| 2008/0054296 A1 | 3/2008 | Yoon et al. |
| 2008/0220555 A1 | 9/2008 | Saxler et al. |
| 2008/0272463 A1 | 11/2008 | Butcher et al. |
| 2008/0303054 A1 | 12/2008 | Yokoyama et al. |
| 2009/0032833 A1 | 2/2009 | Nam |
| 2009/0142870 A1 | 6/2009 | Miki et al. |
| 2009/0289270 A1 | 11/2009 | Hanawa |
| 2010/0171135 A1 | 7/2010 | Engl et al. |
| 2010/0176369 A2 | 7/2010 | Oliver et al. |
| 2011/0294281 A1 | 12/2011 | Zang et al. |
| 2012/0211765 A1 | 8/2012 | Miyoshi et al. |
| 2012/0319162 A1 | 12/2012 | Araki et al. |

FOREIGN PATENT DOCUMENTS

| | | |
|---|---|---|
| DE | 601 21 768 | 7/2007 |
| DE | 10 2006 008 929 | 8/2007 |
| DE | 10 2009 036 843 | 2/2011 |
| EP | 1 041 609 | 10/2000 |
| EP | 1 174 525 | 1/2002 |
| EP | 2 019 437 | 1/2009 |
| EP | 2 056 339 | 5/2009 |
| EP | 2 544 250 | 1/2013 |
| JP | 2006-4970 | 1/2006 |
| JP | 2006-324512 | 11/2006 |
| JP | 2007-95845 | 4/2007 |
| JP | 2008-47762 | 2/2008 |
| JP | 2009-527913 | 7/2009 |
| JP | 2011-82570 | 4/2011 |
| JP | 2011-114123 | 6/2011 |
| TW | 200620425 | 9/1994 |
| TW | 200913322 | 3/2009 |
| TW | 201030837 | 8/2010 |
| WO | 99/38218 | 7/1999 |
| WO | 2007/096405 | 8/2007 |
| WO | 2011/108422 | 9/2011 |

OTHER PUBLICATIONS

Dadgar, A. et al., "Thick, Crack-Free Blue Light-Emitting Diodes on Si(111) Using Low-Temperature AlN Interlayers and in situ $Si_xN_y$ Masking," *Applied Physics Letters*, May 20, 2002, vol. 80, No. 20, pp. 3670-3672.

Wan, J. et al., "Growth of Crack-Free Hexagonal GaN Films on Si(100)," *Applied Physics Letters*, Sep. 3, 2001, vol. 79, No. 10, pp. 1459-1461.

US Office Action dated Apr. 3, 2015 from related U.S. Appl. No. 14/344,825.

English translation of corresponding Notice of Reasons for Rejection dated Mar. 3, 2015 of Japanese Application No. 2014-532294.

English translation of corresponding Notice of Reasons for Rejection dated Feb. 17, 2015 of Japanese Application No. 2014-532297.

English translation of corresponding Notice of Reasons for Rejection dated Nov. 4, 2015 of corresponding Japanese Application No. 2014-532294.

English translation of Taiwanese Notification of the Opinion of Examination dated Jul. 21, 2014 from corresponding Taiwanese Application No. 101135721.

English translation of the Notification of the First Office Action dated Dec. 4, 2015 of corresponding Chinese Application No. 201280048248.4.

* cited by examiner

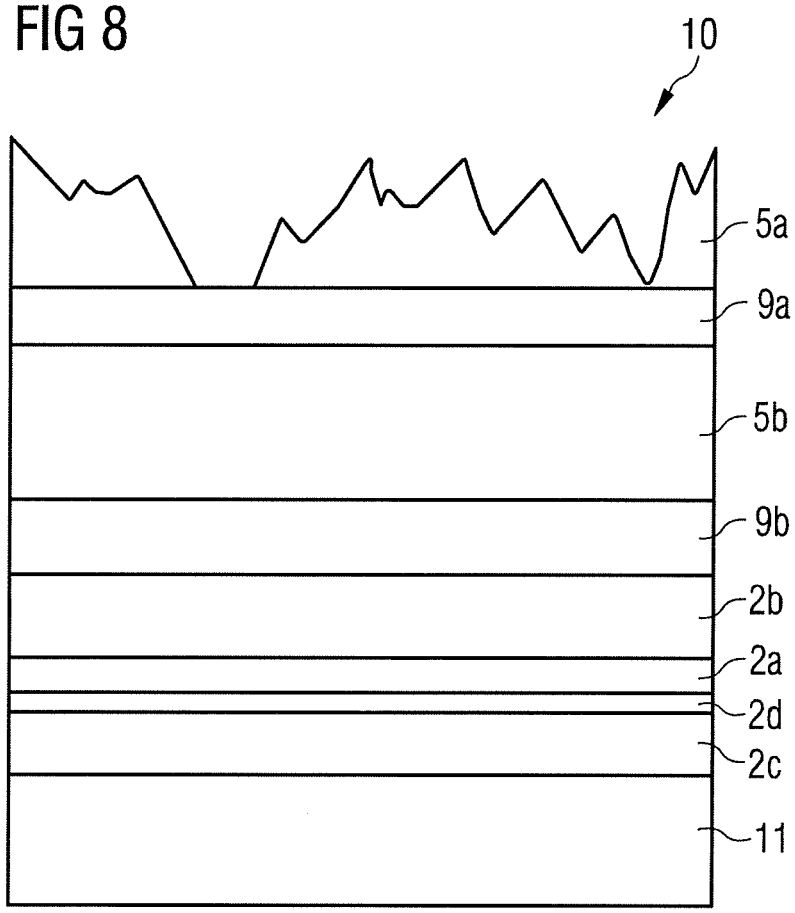

METHOD FOR PRODUCING AN OPTOELECTRONIC SEMICONDUCTOR CHIP AND OPTOELECTRONIC SEMICONDUCTOR CHIP

TECHNICAL FIELD

This disclosure relates to a method of producing an optoelectronic semiconductor chip and an optoelectronic semiconductor chip.

BACKGROUND

It could be helpful to provide a method of efficiently producing an optoelectronic semiconductor chip.

SUMMARY

We provide a method of producing an optoelectronic semiconductor chip including providing a growth substrate, producing a III nitride nucleation layer on the growth substrate by means of sputtering, wherein a material of the growth substrate differs from a material of the nucleation layer, and growing a III nitride semiconductor layer sequence having an active layer onto the nucleation layer.

We also provide an optoelectronic semiconductor chip including a semiconductor layer sequence having an active layer that generates radiation and having at least one n-doped layer, wherein the n-doped layer adjoins the active layer, the semiconductor layer sequence is based on AlInGaN or on InGaN, one or a plurality of central layers composed of AlGaN each having thicknesses of 25 nm to 200 nm are grown at a side of the n-doped layer which faces away from a carrier substrate, a coalescence layer composed of doped or undoped GaN having a thickness of 300 nm to 1.2 µm is formed at a side of the central layer or of one of the central layers facing away from the carrier substrate, a roughening extends from the coalescence layer as far as or into the n-doped layer, a radiation exit area of the semiconductor layer stack is formed partly by the coalescence layer, the central layer is exposed in places, and the semiconductor chip is produced by a method according to claim 1.

We further provide a method of producing an optoelectronic semiconductor chip including providing a growth substrate, producing a III nitride nucleation layer on the growth substrate by sputtering, wherein a material of the growth substrate differs from a material of the nucleation layer, and growing a III nitride semiconductor layer sequence having an active layer onto the nucleation layer, wherein oxygen is admixed with the nucleation layer and a proportion of oxygen in the nucleation layer decreases monotonically in a direction away from the growth substrate.

BRIEF DESCRIPTION OF THE DRAWINGS

FIGS. 3 to 6 and 8 show schematic sectional illustrations of examples of optoelectronic semiconductor chips.

DETAILED DESCRIPTION

Figure 1:
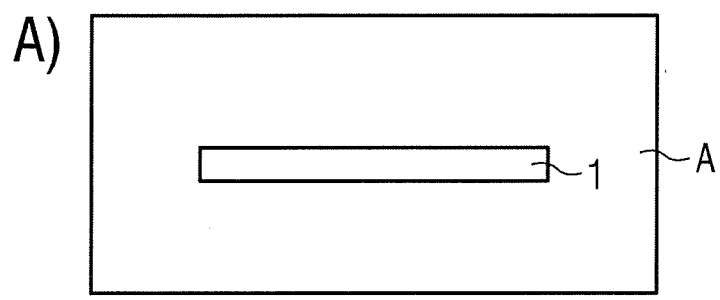
FIGS. 1, 2 and 7 show schematic illustrations of examples of methods described herein to produce optoelectronic semiconductor chips.
Figure 1:
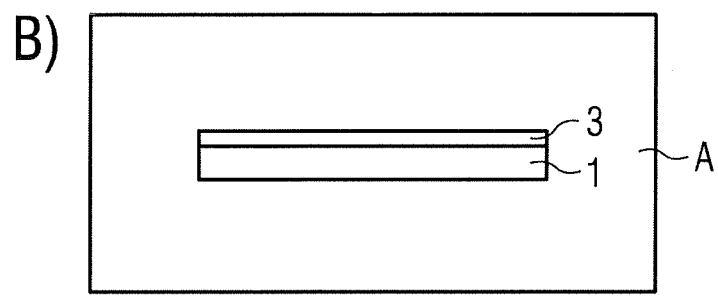
Figure 1:
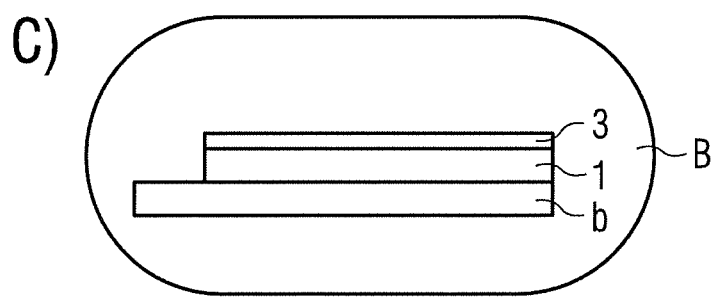
Figure 1:
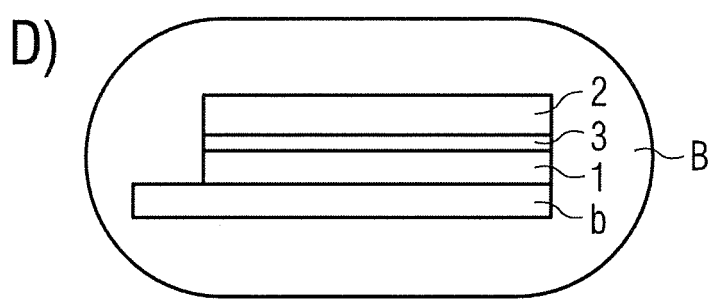
Figure 1:
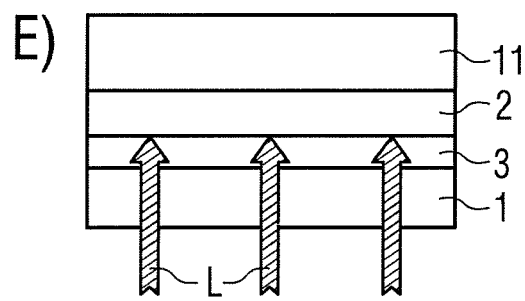
Figure 1:
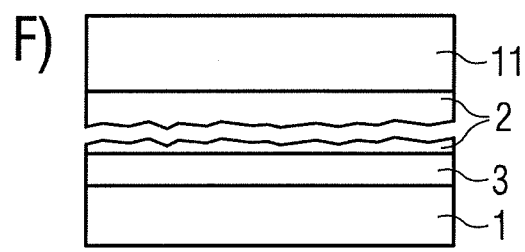
Figure 1:

Our methods may comprise the step of producing a III nitride nucleation layer above a growth substrate. The nucleation layer is produced by sputtering. In other words, the nucleation layer is not produced by a vapor phase epitaxy such as metal organic chemical vapor phase epitaxy, MOVPE for short.

A III nitride semiconductor layer sequence having an active layer may be grown above the nucleation layer. The active layer of the semiconductor layer sequence generates electromagnetic radiation, in particular, in the ultraviolet or visible spectral range during operation of the semiconductor chip. In particular, a wavelength of the generated radiation is 430 nm to 680 nm. The active layer preferably comprises one or a plurality of pn junctions or one or a plurality of quantum well structures.

The semiconductor material is preferably a nitride compound semiconductor material such as $Al_n In_{1-n-m} Ga_m N$ where $0 \le n \le 1$, $0 \le m \le 1$ and $n+m \le 1$. In this case, the semiconductor layer sequence can comprise dopants and additional constituents. For the sake of simplicity, however, only the essential constituents of the crystal lattice of the semiconductor layer sequence, that is to say Al, Ga, In and N, are specified, even if these can be replaced and/or supplemented in part by small amounts of further substances.

The following equations may be applied: $0 \le n \le 0.3$ and/or $0.35 \le m \le 0.95$ and/or $0 < 1-n-m \le 0.5$. The stated ranges of values for n and m preferably hold true for all sublayers of the semiconductor layer sequence, dopants not being included. It is possible in this case, however, for the semiconductor layer sequence to have one or a plurality of central layers for which a departure is made from the stated values for n, m and instead it holds true that $0.75 \le n \le 1$ or $0.80 \le n \le 1$.

The method may comprise the step of providing the growth substrate. The growth substrate is based on a material system which differs from a material of the nucleation layer and/or of the semiconductor layer sequence. In other words, the growth substrate is a so-called "foreign" substrate. By way of example, the growth substrate is a silicon substrate, a sapphire substrate having an r-face or c-face as a growth face, a germanium substrate, a gallium arsenide substrate, a molybdenum substrate, a silicon carbide substrate or a substrate composed of a metal alloy. In particular, a coefficient of thermal expansion of the growth substrate deviates from a coefficient of thermal expansion of the semiconductor layer sequence to be grown by at most 50% or by at most 20%.

The method may produce an optoelectronic semiconductor chip, in particular, a light-emitting diode. The method may comprise at least the following steps, preferably in the order indicated:

providing a growth substrate,
producing a III nitride nucleation layer on the growth substrate by means of sputtering, and
growing a III nitride semiconductor layer sequence having an active layer onto or above the nucleation layer.

In this case, a material of the growth substrate differs from a material of the nucleation layer and/or of the semiconductor layer sequence.

In contrast to MOVPE, thick layers can be produced comparatively cost-effectively and with relatively high growth rates by sputtering. In this regard, by way of example, layers composed, for instance, of AlN and having a thickness of up to 1 µm can be deposited within a few minutes.

Furthermore, as a result of the nucleation layer being produced by sputtering, the subsequent MOVPE process can be shortened and/or simplified. In particular, it is possible to dispense with an additional nucleation step. The nucleation layer is preferably produced directly on the growth substrate.

Moreover, it is possible, as a result of the sputtering of the nucleation layer, to reduce the use of aluminum in the MOVPE process to produce the semiconductor layer sequence. Graphite holders are typically used as substrate holders on account of the high temperatures in the MOVPE process. The graphite holder can be covered by a thin, whitish aluminum-containing and/or gallium-containing layer in the MOVPE, as a result of which a thermal radiation behavior and a heating behavior of the graphite holder are altered. As a result of the nucleation layer being produced by sputtering, outside a vapor phase epitaxy reactor, covering the graphite holder with aluminum and/or gallium is significantly reduced and parameters for the subsequent MOVPE process can be set more easily.

Oxygen may be admixed with the nucleation layer during sputtering. A proportion by weight of the oxygen in the nucleation layer, which is based on aluminum nitride, in particular, is preferably at least 0.1% or at least 0.2% or at least 0.5%. Furthermore, a proportion by weight of the oxygen in the nucleation layer is preferably at most 10% or at most 5% or at most 1.5%. The introduction of oxygen in nucleation layers is also specified in DE 100 34 263 B4, the subject matter of which is incorporated herein by reference.

A proportion of oxygen in the nucleation layer may be reduced monotonically or strictly monotonically in a direction away from the growth substrate. In particular, a highest oxygen concentration is present in a thin layer having a thickness of 10 nm to 30 nm directly at the growth substrate. The oxygen content can decrease in a stepped manner or linearly in a direction away from the growth substrate.

The nucleation layer may be grown with a thickness of at least 10 nm or of at least 30 nm or of at least 50 nm. Alternatively or additionally, the thickness of the nucleation layer is at most 1000 nm or at most 200 nm or at most 150 nm. In particular, the thickness of the nucleation layer is approximately 100 nm.

The growth substrate may be removed by a laser lift-off method. Alternatively or additionally, it is possible for wet-chemical etching to be used during the removal of the growth substrate.

The growth substrate and the nucleation layer may be transmissive to a laser radiation used during the lift-off method. In other words, the materials of the growth substrate and the nucleation layer then do not or do not significantly absorb the laser radiation used.

The laser radiation may result in a material decomposition at an interface between the nucleation layer and the semiconductor layer sequence or at an interface between the nucleation layer and a growth layer. The material decomposition, which leads to detachment of the semiconductor layer sequence from the growth substrate, therefore, preferably does not take place in direct proximity to the growth substrate.

A sacrificial layer may be produced between the nucleation layer and the growth substrate. The sacrificial layer is preferably in direct contact both with the growth substrate and with the nucleation layer. The sacrificial layer can be produced, for example, by atomic layer deposition, or ALD for short, or else by vapor deposition or by sputtering.

The sacrificial layer may be formed by a material which can be decomposed wet-chemically, wherein, during the wet-chemical decomposition, the growth substrate and the semiconductor layer sequence and/or the growth layer are not or are not significantly decomposed as well. By way of example, the sacrificial layer comprises or consists of an aluminum oxide such as $Al_2O_3$. A thickness of the sacrificial layer is, for example, 50 nm to 200 nm.

The growth substrate, in particular at a side facing the semiconductor layer sequence, need not nor need not significantly be destroyed. In particular, a surface constitution of the side of the growth substrate is maintained or maintained to the greatest possible extent. Upon detachment of the growth substrate, therefore, preferably only part of the semiconductor layer sequence and/or part of the growth layer or of the sacrificial layer are then destroyed.

A growth layer may be applied directly on the nucleation layer. In other words, an intermediate layer formed, for example, by AlGaN having an aluminum content that decreases in a direction away from the growth substrate, is then obviated. The growth layer is preferably a doped or else an undoped GaN layer. A thickness of the growth layer is, in particular, 50 nm to 300 nm. The growth layer is preferably produced by sputtering or by MOVPE.

A masking layer may be applied in particular directly to the growth layer. The masking layer is formed, for example, from a silicon nitride, a silicon oxide, a silicon oxynitride or from boron nitride or magnesium oxide. A thickness of the masking layer is preferably at most 2 nm or at most 1 nm or at most 0.5 nm. In particular, the masking layer is produced with a thickness amounting on average to one or two monolayers. The masking layer can be produced by sputtering or by MOVPE.

The masking layer may be applied to the underlying layer with a degree of coverage of at least 20% or of at least 50% or of at least 55%. Preferably, the degree of coverage is at most 90% or at most 80% or at most 70%. In other words, the growth substrate and/or the growth layer, as seen in plan view, is then covered by a material of the masking layer to the extent of the proportions mentioned. Therefore, the growth layer is then exposed in places.

The growth layer and the masking layer may be produced by sputtering, as is the nucleation layer. The nucleation layer and the growth layer and also the masking layer can be produced in the same sputtering deposition installation.

A coalescence layer may be grown, for example, by vapor phase epitaxy, in particular directly onto the masking layer and onto the growth layer exposed in places. The coalescence layer is preferably based on undoped or substantially undoped GaN. The coalescence layer grows on the growth layer exposed in places, and thus in openings of the masking layer. Proceeding from the openings in the masking layer, the coalescence layer coalesces to form a closed layer having comparatively few defects.

The coalescence layer may be grown with a thickness of at least 300 nm or of at least 400 nm. Alternatively or additionally, the thickness is at most 3 µm or at most 1.2 µm.

A central layer may be grown onto the coalescence layer, in particular in direct physical contact. The central layer is preferably an AlGaN layer having an aluminum content of 5% to 15% or 75% to 100%. A thickness of the central layer is preferably 5 nm to 50 nm, in particular 10 nm to 20 nm or 30 nm to 100 nm or 10 nm to 200 nm. The central layer can be doped.

A plurality of central layers may be grown, wherein the central layers can each be formed identically within the scope of the production tolerances. A respective GaN layer, which can be doped or undoped, is preferably situated between two adjacent central layers. The GaN layer is furthermore preferably in direct contact with the two adjacent central layers. A thickness of the GaN layer is then preferably at least 20 nm or at least 50 nm or at least 500 nm and can alternatively or additionally be at most 3000 nm or at most 2000 nm or at most 1000 nm.

The semiconductor layer sequence having the active layer may be grown onto the central layer or one of the central layers situated furthest away from the growth substrate. The semiconductor layer sequence is preferably in direct contact with the central layer and is based on AlInGaN or on InGaN.

A layer of the semiconductor layer sequence which adjoins the central layer is preferably n-doped. An n-doping is effected, for example, with silicon and/or with germanium.

A temperature of 550° C. to 900° C. may be present during sputtering of the nucleation layer and/or of the growth layer and/or of the masking layer. A pressure during sputtering is furthermore in particular $10^{-3}$ mbar to $10^{-2}$ mbar.

A growth rate during the sputtering of the nucleation layer or else of the other layers produced by sputtering may be at least 0.03 nm/s and/or at most 0.5 nm/s. The sputtering is preferably carried out under an atmosphere comprising argon and nitrogen. A ratio of argon to nitrogen is preferably 1:2, with a tolerance of at most 15% or of at most 10%.

A carrier substrate may be fitted to a side of the semiconductor layer sequence situated opposite the growth substrate. Further layers, in particular mirror layers, electrical contact layers and/or connecting means layers such as solders can be situated between the semiconductor layer sequence and the carrier substrate. The carrier substrate is, for example, a carrier composed of a ceramic or composed of a semiconductor material such as germanium or composed of a metal such as molybdenum. The carrier substrate can comprise electrical conductor tracks.

The nucleation layer may be produced in a sputtering deposition installation and the semiconductor layer sequence is grown in a vapor phase epitaxy reactor different therefrom. Particularly preferably, the sputtering deposition installation is free of gallium and/or free of graphite.

An optoelectronic semiconductor chip is furthermore disclosed. The optoelectronic semiconductor chip can be produced by a method as specified in one or more of the examples described above. Features of the method are therefore also disclosed for the optoelectronic semiconductor chip, and vice versa.

The optoelectronic semiconductor chip may comprise a semiconductor layer sequence having an active layer that generates radiation. The semiconductor layer sequence furthermore comprises at least one n-doped layer and at least one p-doped layer, wherein these doped layers preferably directly adjoin the active layer. The semiconductor layer sequence is based on AlInGaN or on InGaN.

The semiconductor chip comprises a carrier substrate at a p-side of the semiconductor layer sequence. A central layer is situated at a side of the n-doped layer of the semiconductor layer sequence facing away from the carrier substrate, the central layer being based on AlGaN and having a high aluminum content and being grown with a thickness of 5 nm to 50 nm. A plurality of central layers can be formed, between which gallium nitride layers are situated.

A coalescence layer composed of doped or undoped GaN having a thickness of 300 nm to 1.5 μm is situated at a side of the central layer or of one of the central layers which faces away from the carrier substrate. Furthermore, the semiconductor chip is provided with a roughening that extends from the coalescence layer as far as or into the n-doped layer of the semiconductor layer sequence. A radiation exit area of the semiconductor layer sequence is formed partly by the coalescence layer. The or at least one of the central layers is exposed in places by the roughening.

A method described here and a semiconductor chip described here are explained in greater detail below on the basis of examples with reference to the drawings. In this case, identical reference signs indicate identical elements in the individual figures. In this case, however, relations to scale are not illustrated. Rather, individual elements may be illustrated with exaggerated size to afford a better understanding.

FIG. 1 schematically illustrates a method of producing an optoelectronic semiconductor chip 10. In accordance with FIG. 1A, a growth substrate 1 is provided in a sputtering deposition installation A. The growth substrate 1 is a sapphire substrate, for example. In the method step in accordance with FIG. 1B, a nucleation layer 3 is sputtered onto the growth substrate 1 in the sputtering deposition installation A. The nucleation layer 3 is an AlN layer, which is preferably provided with oxygen.

The temperature during sputtering of the nucleation layer 3 is, for example, approximately 760° C. The pressure in the sputtering deposition installation A is, in particular, approximately $5 \times 10^{-2}$ mbar, an argon-nitrogen atmosphere being present. The deposition rate during the sputtering of the nucleation layer 3 is approximately 0.15 nm/s. The sputtering power can be 0.5 kW to 1.5 kW, in particular approximately 0.5 kW. The nucleation layer 3 is produced with a thickness of approximately 100 nm. The sputtering deposition installation A is free of gallium.

In the method step in accordance with FIG. 1C, the growth substrate 1 with the nucleation layer 3 is transferred from the sputtering deposition installation A into an MOVPE reactor B. The growth substrate 1 is situated on a substrate holder b preferably formed from graphite. By virtue of the fact that the AlN nucleation layer 3 is produced in the sputtering deposition installation A, rather than in the MOVPE reactor B, coating of the substrate holder b with a reflective covering with aluminum and/or gallium can be prevented or greatly reduced.

To grow a semiconductor layer sequence 2 having an active layer provided to generate radiation, the growth substrate 1 with the nucleation layer 3 remains in the MOVPE reactor B. The semiconductor layer sequence 2 is therefore applied epitaxially to the sputtered nucleation layer 3.

In accordance with FIG. 1E, laser radiation L is radiated onto the semiconductor layer sequence 2 through the growth substrate 1 and the nucleation layer 3. The laser radiation L has a wavelength of approximately 355 nm, for example. By way of example, aluminum nitride as material for the nucleation layer 3 has an absorption edge at approximately 210 nm and is thus transparent to the laser radiation L. Therefore, the laser radiation L is absorbed at that side of the semiconductor layer sequence 2 which faces the nucleation layer 3. Consequently, a material decomposition, also cf. FIG. 1F, takes place near an interface between the semiconductor layer sequence 2 and the nucleation layer 3. In this case, a small part of the semiconductor layer sequence 2 remains at the nucleation layer 3.

Therefore, no material destruction takes place directly at the growth substrate 1. As a result, a surface of the growth substrate 1 which faces the nucleation layer 3 is not or is not significantly damaged during the laser lift-off method. This is made possible in particular by the comparatively large thickness of the nucleation layer 3, which can be realized by the application of the nucleation layer 3 by sputtering.

In accordance with FIG. 1G, the residues of the nucleation layer 3 are removed from the growth substrate 1. This removal can be effected by a wet-chemical etching which selectively removes material of the nucleation layer 3 and does not or does not significantly attack material of the growth substrate 1.

By virtue of the fact that the growth substrate 1 is not damaged during the laser lift-off method, a so-called "reclaim" process, wherein the surface of the growth substrate is restored in particular by polishing, can be avoided. In the course of such polishing, the growth substrate loses a thickness of approximately 50 μm. Consequently, as a result of the comparatively thick nucleation layer 3, the growth substrate 1, which as a rule is of high quality and expensive, is protectable and usable repeatedly and preferably without costly reclaim processes.

The method in accordance with FIG. 1 preferably takes place in the wafer assemblage. Further method steps such as division into individual semiconductor chips 10 or production of additional functional layers are not shown in the figures to simplify the illustration.

Figure 2:
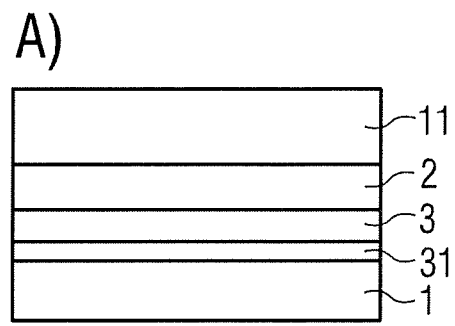
Figure 2:
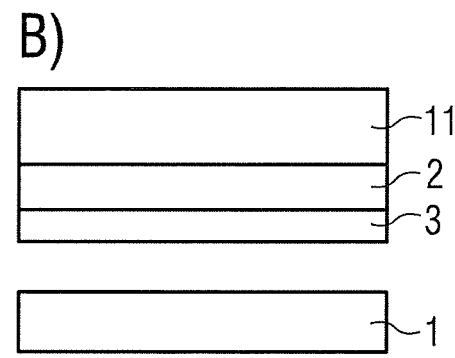

FIGS. 2A and 2B illustrate alternative method steps for the removal of the growth substrate 1. In accordance with FIG. 2A, a sacrificial layer 31 composed of $Al_2O_3$ is produced between the growth substrate 1 and the nucleation layer 3, in a departure from the production method in accordance with FIG. 1.

The sacrificial layer 31 can be decomposed wet-chemically, as a result of which the growth substrate 1 can be separated from the semiconductor layer sequence 2, cf. FIG. 2B. Upon the removal of the sacrificial layer 31, the growth substrate 1 and/or the nucleation layer 3 remain undestroyed or undestroyed to the greatest possible extent. As a result, repeated use of the growth substrate 1, without costly reclaim steps, is possible.

Figure 3:
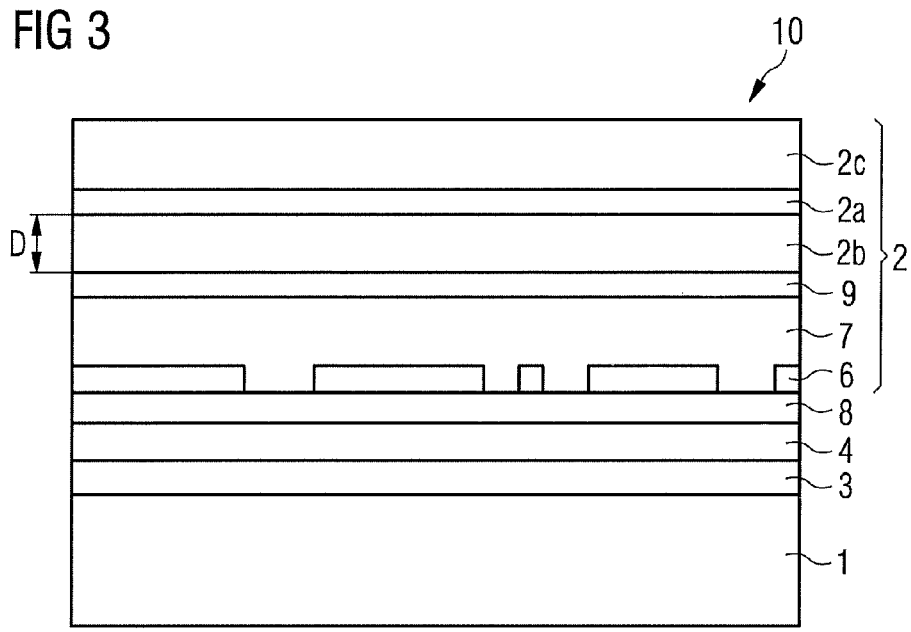

FIG. 3 schematically illustrates one example of the optoelectronic semiconductor chip 10. The sputtered nucleation layer 3 is situated on the growth substrate 1. Besides oxygen or as an alternative thereto, the nucleation layer 3 can also comprise indium and/or silicon.

The nucleation layer 3 is optionally followed by an intermediate layer 4. Such an intermediate layer 4 is preferably used if the growth substrate 1 is a silicon substrate. The intermediate layer 4, applied directly to the nucleation layer 3, preferably has a plurality of plies, not depicted in FIG. 2. The plies, for example, each have thicknesses of approximately 50 nm and exhibit an aluminum content that decreases in a direction away from the growth substrate 1, wherein the aluminum content of the individual plies can be approximately 95%, 60%, 30% and 15%, in particular with a tolerance of at most ten percentage points or at most five percentage points.

The intermediate layer 4 optionally present is followed directly by a growth layer 8 composed of doped or undoped GaN. If the intermediate layer 4 is not present, then the growth layer 8 preferably directly succeeds the nucleation layer 3. A thickness of the growth layer 8 is preferably approximately 200 nm. If the growth layer 8 is doped, then a dopant concentration is preferably at least a factor of 2 lower than a dopant concentration of an n-doped layer 2b of the semiconductor layer sequence 2.

In a direction away from the growth substrate 1, the growth layer 8 is succeeded directly by a masking layer 6. The masking layer 6 covers the growth layer 8 preferably to the extent of approximately 60% or to the extent of approximately 70%. The growth layer 8 is formed, for example, from a few monolayers of silicon nitride.

In openings of the masking layer 6, a coalescence layer 7 composed of doped or undoped GaN grows at the growth layer 8. In a direction away from the growth substrate 1, the coalescence layer 7 coalesces to form a continuous layer. The thickness of the coalescence layer 7 is, for example, 0.5 µm to 1.0 µm.

The coalescence layer 7 is succeeded directly by a central layer 9. Preferably, the central layer 9 is an AlGaN layer having an aluminum content of approximately 10% and having a thickness of approximately 30 nm or of approximately 60 nm. The central layer 9 can optionally also be dispensed with.

The central layer 9 is followed by the n-doped layer 2b of the semiconductor layer sequence 2, which adjoins an active layer 2a. At least one p-doped layer 2c is situated at a side of the active layer 2a which faces away from the growth substrate 1. The layers 2a, 2b, 2c of the semiconductor layer sequence 2 are preferably based on InGaN. A dopant concentration of the n-doped layer 2b can be $5 \times 10^{18}/cm^{-3}$ to $1 \times 10^{20}/cm^{-3}$ or $1 \times 10^{19}/cm^{-3}$ to $6 \times 10^{19}/cm^{-3}$. The n-doped layer 2b is preferably doped with germanium and/or with silicon. The p-doped layer 2c is preferably doped with magnesium.

A thickness D of the n-doped layer 2b is, for example, 1.0 µm to 4 µm, in particular 1.5 µm to 2.5 µm. In a region of the n-doped layer 2b that is closest to the central layer 9, wherein this region has a thickness preferably of 100 nm to 500 nm, a dopant concentration is optionally reduced and is in this region, for example, of $5 \times 10^{17}/cm^{-3}$ to $1 \times 10^{19}/cm^{-3}$, in particular approximately $1 \times 10^{18}/cm^{-3}$. This lightly doped region is not depicted in the figures.

Figure 4:
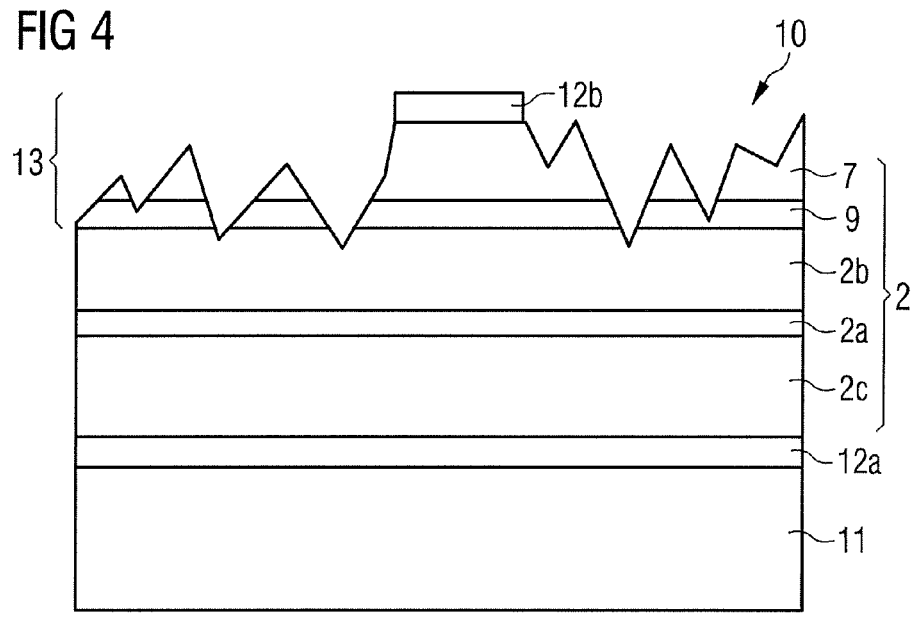

In the example of the semiconductor chip 10 in accordance with FIG. 4, the growth substrate 1 and also the nucleation layer 3 and the intermediate layer 4 are removed, as is also possible in connection with FIG. 3. A first contact layer 12a is fitted to a p-side of the semiconductor layer sequence 2. The semiconductor layer sequence 2 connects to a carrier substrate 11 via the first contact layer 12a. A thickness of the carrier substrate 11 is preferably 50 µm to 1 mm.

A roughening 13 is produced at a side of the semiconductor layer sequence 2 facing away from the carrier substrate 11. The roughening 13 extends as far as or into the n-doped layer 2b of the semiconductor layer sequence 2. Therefore, the n-doped layer 2b and the central layer 9 are exposed in places by the roughening. Particularly preferably, the masking layer 6 is completely removed by the roughening 13.

Optionally, a further contact layer 12b is fitted to the side facing away from the carrier substrate, via which further contact layer the semiconductor chip 10 is electrically contact-connectable and energizable, for instance by a bonding wire. Further optional layers such as mirror layers or connecting layers are not depicted in the figures.

Figure 5:
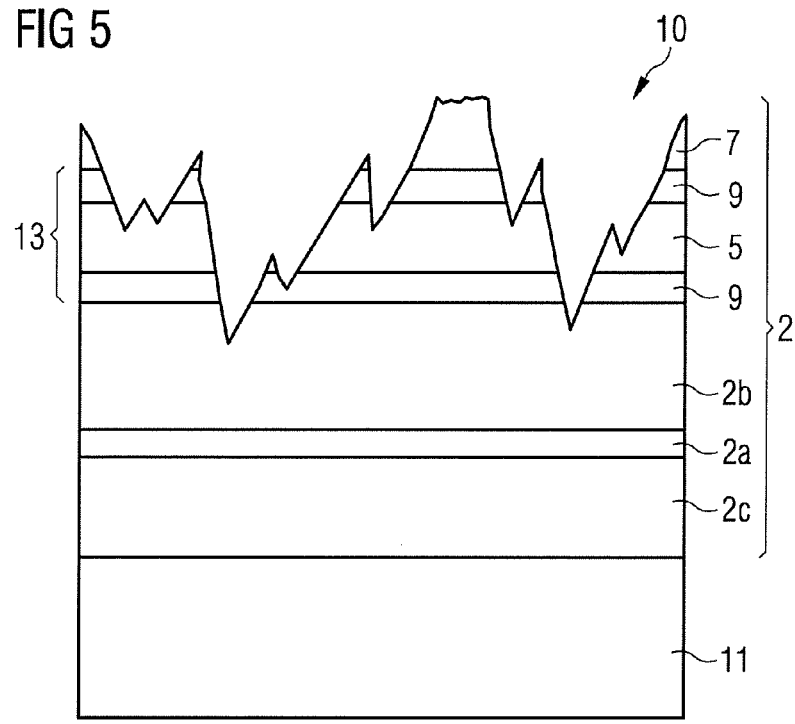

A further example of the semiconductor chip 10 can be seen in FIG. 5. The semiconductor chip 10 in accordance with FIG. 5 comprises two central layers 9, between which a GaN layer 5 is situated. In contrast to the illustration in FIG. 5, it is also possible for more than two central layers 9 to be present, which are each constructed identically to one another or differently from one another.

The roughening 13 extends through both central layers 5 right into the n-doped layer 2b. In contrast to the illustration, it is possible for one of the central layers 9 not to be affected by the roughening. Furthermore, it is possible for the central layer 9 closest to the active layer 2a to be an etching stop layer for the production of the roughening 13.

Figure 6:
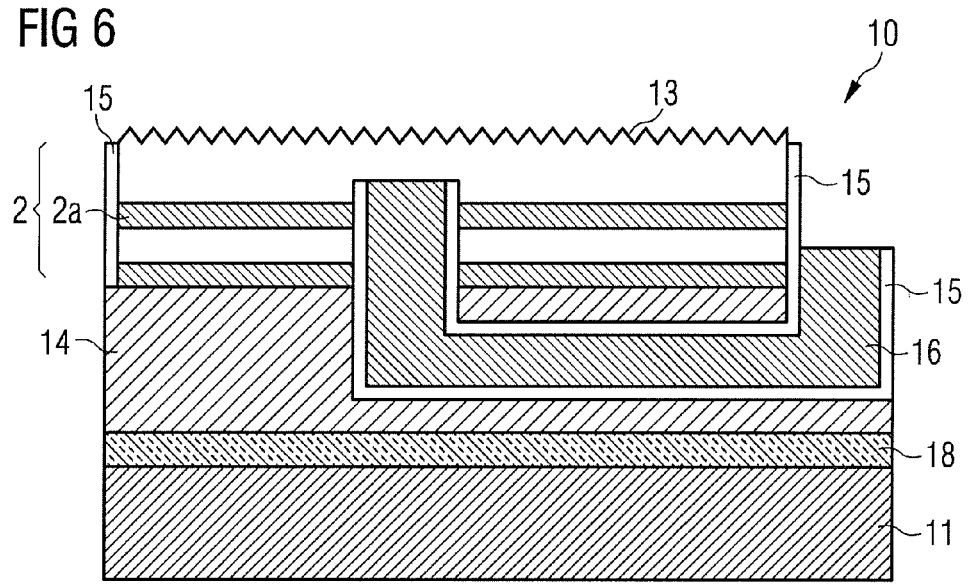

FIG. 6 shows a further example of the semiconductor chip 10. The semiconductor layer sequence 2 is fixed to the carrier substrate 11 via a connector 18, which is a solder, for example. That side of the semiconductor layer sequence 2 facing the carrier substrate 11 is electrically contact-connected via a first electrical connection layer 14 and via the carrier substrate 11.

A side of the semiconductor layer sequence 2 facing away from the carrier substrate 11 is furthermore contact-connected via a second electrical connection layer 16. The second connection layer 16 penetrates through the active layer 2a, as seen from the carrier substrate 11, and is led laterally alongside the semiconductor layer sequence 2. By way of example, the second connection layer 16 can be connected laterally alongside the semiconductor layer sequence 2 to a bonding wire, not depicted.

The roughening 13 does not extend as far as the second connection layer 16. Furthermore, the connection layers 16, 14 are electrically insulated from one another by a separating layer 15, for example, composed of silicon oxide or a silicon nitride. The central layer and the coalescence layer are not depicted in FIG. 6. The semiconductor chip 10 can thus be similar to that specified in US 2010/0171135 A1, the subject matter of which is incorporated herein by reference.

Figure 7:
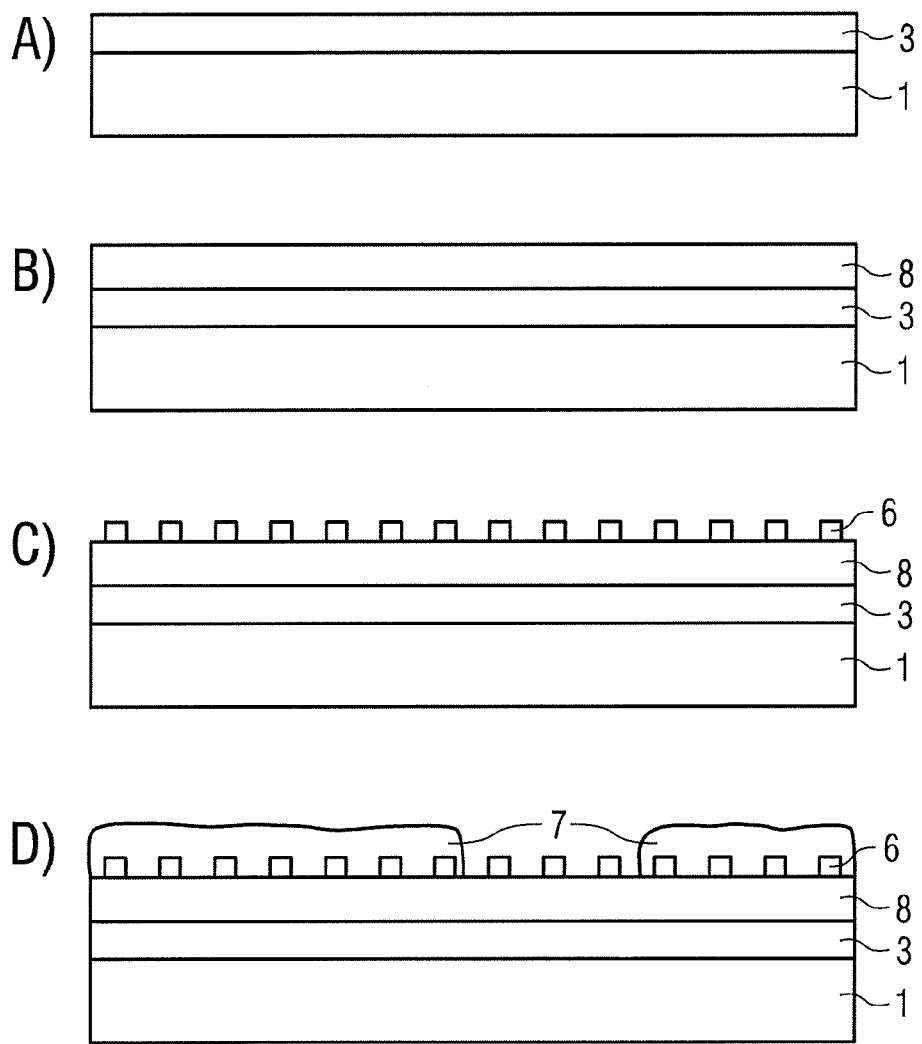

FIG. 7 shows first method steps of producing the semiconductor chip 10, for example, as illustrated in FIG. 3. According to FIG. 7A, the nucleation layer 3 is produced directly on the growth substrate 1. In accordance with FIG. 7B, the growth layer 8 is grown directly onto the nucleation layer 3. The masking layer 6 is fitted in regions onto the growth layer 8, which can have a thickness of approximately 1 μm, cf. FIG. 7C. All these layers can be applied by sputtering.

A defect density of the GaN can lie in the range of approximately $3\times10^9$ cm$^{-2}$ in the growth layer 8. As a result of the coalescence layer 7, in conjunction with the masking layer 6, it is possible to reduce the defect density in the semiconductor layer sequence 2, in particular in the n-doped layer 2b, by approximately one order of magnitude.

FIG. 7D illustrates how the coalescence layer 7 coalesces, proceeding from openings in the masking layer 6. A degree of coverage with the masking layer 6 is approximately 70%, for example. FIG. 7D schematically illustrates the coalescence layer 7 in a state in which it has not yet fully coalesced. A thickness of the coalesced coalescence layer 7 can be approximately 1.2 μm. The further method steps are not depicted in FIG. 7.

Method steps 7A to 7C preferably take place in the same sputtering deposition installation, not illustrated in FIG. 7. An MOVPE is preferably employed starting from the method step in accordance with FIG. 7D.

A further example of the semiconductor chip 10 is shown in FIG. 8. The semiconductor chip 10 is preferably produced by methods as illustrated in FIGS. 1 and 7. Electrical contact structures such as conductor tracks or bonding wires are not depicted in FIG. 8.

The semiconductor layer sequence 2 having the p-doped layer 2c, the active layer 2a and the n-doped layer 2b is situated at the carrier substrate 11. Preferably, an electron barrier layer 2d is situated between the active layer 2a and the p-doped layer 2c, as also in all the other examples.

The n-doped layer 2b has, for example, a thickness of 100 nm to 300 nm, in particular approximately 200 nm. A dopant concentration of the n-doped layer 2b is preferably less than $1\times10^{18}$ cm$^{-3}$. The n-doped layer 2b is adjoined by the second central layer 9b, followed in a direction away from the carrier substrate 11 by the second GaN layer 5b, the first central layer 9a and the first GaN layer 5a.

The first central layer 9a preferably has a thickness of 15 nm to 50 nm, for example, approximately 30 nm. A thickness of the second central layer 9b is greater and is, in particular, 25 nm to 100 nm, for example, approximately 60 nm. The two central layers 9a, 9b are formed from AlGaN having an Al content of preferably 5% to 15% inclusive. Such optional central layers 9a, 9b and the likewise optional GaN layers 5a, 5b can also be present in all the other examples.

The roughening 13 can in places extend as far as the first central layer 9a, but preferably does not penetrate through the first central layer 9a and the layers nearer the carrier substrate 11. In contrast to the illustration, it is also possible for the roughening 13 not to extend as far as the central layer 9a.

The second GaN layer 5b preferably has a thickness of 0.5 μm to 2 μm or 0.8 μm to 1.2 μm, for example, approximately 1 μm. A dopant concentration of the second GaN layer 5b is preferably at least $1\times10^{19}$ cm$^{-3}$. The first GaN layer 5a has a maximum thickness of, in particular, at most 4 μm or of at most 3 μm and/or of at least 1 μm or of at least 2 μm.

The first GaN layer 5a is grown, for example, on a coalescence layer 7 with a thickness of approximately 1.2 μm, cf. FIG. 7D. The layers 1, 3, 8, 6, 7 illustrated in FIG. 7 are removed from the semiconductor chip 10 in accordance with FIG. 8 after the carrier substrate 11 has been fitted.

Our methods and chips are not restricted by the description on the basis of the examples. Rather, this disclosure encompasses every novel feature and also every combination of features, which in particular includes every combination of features in the appended claims, even if the feature or combination itself is not explicitly specified in the claims or examples.

The invention claimed is:

1. A method of producing an optoelectronic semiconductor chip comprising:
   providing a growth substrate,
   producing a III nitride nucleation layer on the growth substrate by sputtering, wherein a material of the growth substrate differs from a material of the nucleation layer, and
   growing a III nitride semiconductor layer sequence having an active layer onto the nucleation layer.

2. The method according to claim 1, wherein a sacrificial layer is produced between the nucleation layer and the growth substrate, the sacrificial layer comprises an aluminum oxide and the sacrificial layer is decomposed at least partly wet-chemically upon separation of the growth substrate from the semiconductor layer sequence.

3. The method according to claim 2, wherein the growth substrate is not destroyed upon detachment from the semiconductor layer sequence at a side facing the semiconductor layer sequence.

4. The method according to claim 1, wherein the nucleation layer has a thickness of 10 nm to 1000 nm, and the nucleation layer is based on MN and is applied directly to the growth substrate.

5. The method according to claim 1, wherein a carrier substrate is fitted to a side of the semiconductor layer sequence facing away from the growth substrate, and the growth substrate is subsequently removed by a laser lift-off method.

6. The method according to claim 5, wherein the growth substrate and the nucleation layer are transmissive to a laser radiation used during the lift-off method, and the laser radiation results in a material decomposition at an interface between the nucleation layer and the semiconductor layer sequence and/or a growth layer.

7. The method according to claim 1, wherein oxygen is admixed with the nucleation layer, and a proportion by weight of the oxygen is 0.1% to 10%.

8. The method according to claim 7, wherein a proportion of oxygen in the nucleation layer decreases monotonically in a direction away from the growth substrate.

9. The method according to claim 1, wherein the growth layer is applied directly on the nucleation layer by sputtering or vapor phase epitaxy, and the growth layer is based on GaN.

10. The method according to claim 1, wherein the following layers are produced onto the growth layer in a manner one directly on top of another and in the order indicated:

a masking layer, based on a silicon nitride, a silicon oxide or magnesium oxide, wherein the masking layer covers the growth layer with a degree of coverage of 50% to 90%, a coalescence layer, based on GaN, one or a plurality of central layers composed of AlGaN, wherein, in the case of a plurality of central layers, a respective GaN layer is grown between two adjacent central layers, and the semiconductor layer sequence, based on AlInGaN or on InGaN.

11. The method according to claim 1, wherein the sputtering is carried out at a temperature of 550° C. to 900° C. and at a pressure of $1\times10^{-3}$ mbar to $1\times10^{-2}$ mbar.

12. The method according to claim 1, wherein a growth rate during the sputtering is 0.03 nm/s to 0.5 nm/s, and the sputtering is carried out under an atmosphere comprising Ar and comprising $N_2$ and a ratio of Ar to $N_2$ is 1 to 2, with a tolerance of at most 15%.

13. The method according to claim 1, wherein the nucleation layer is produced in a sputtering deposition installation (A), the semiconductor layer sequence is grown in a vapor phase epitaxy reactor (B) different therefrom, and the sputtering deposition installation (A) is free of gallium.

14. A method of producing an optoelectronic semiconductor chip comprising:

providing a growth substrate, producing a III nitride nucleation layer on the growth substrate by means of sputtering, wherein a material of the growth substrate differs from a material of the nucleation layer, and growing a III nitride semiconductor layer sequence having an active layer onto the nucleation layer, wherein oxygen is admixed with the nucleation layer and a proportion of oxygen in the nucleation layer decreases monotonically in a direction away from the growth substrate.

15. The method according to claim 14, wherein the proportion of oxygen in the nucleation layer decreases strictly monotonically in a direction away from the growth substrate.

16. The method according to claim 14, wherein the highest oxygen concentration is present in a thin layer having a thickness of 10 nm to 30 nm directly at the silicon growth substrate.

17. The method according to claim 14, wherein oxygen content decreases in a stepped manner or linearly in a direction away from the growth substrate.

* * * * *